United States Patent
Ho et al.

(10) Patent No.: US 12,540,855 B2
(45) Date of Patent: Feb. 3, 2026

(54) WIDE-BAND PHOTODETECTORS USING THERMOELECTRIC MATERIALS

(71) Applicant: City University of Hong Kong, Hong Kong (HK)

(72) Inventors: Johnny Chung Yin Ho, Hong Kong (HK); Yuxuan Zhang, Hong Kong (HK); You Meng, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 344 days.

(21) Appl. No.: 18/366,643

(22) Filed: Aug. 7, 2023

(65) Prior Publication Data
US 2025/0052621 A1    Feb. 13, 2025

(51) Int. Cl.
*G01J 5/14* (2006.01)
*H10N 10/01* (2023.01)
*H10N 10/852* (2023.01)

(52) U.S. Cl.
CPC .............. *G01J 5/14* (2013.01); *H10N 10/01* (2023.02); *H10N 10/852* (2023.02)

(58) Field of Classification Search
CPC ...... H10N 10/01; H10N 10/852; H10N 10/85; H10N 10/17; H10N 10/13; H10N 10/817;
(Continued)

(56) References Cited

U.S. PATENT DOCUMENTS 9,915,567 B2 * 3/2018 Kropelnicki ........ H10F 71/1278
2011/0220164 A1 * 9/2011 Guha ..................... H10N 10/01
                                                                    438/54
(Continued)

OTHER PUBLICATIONS

Junzhu Li et al., Wafer-scale single-crystal monolayer graphene grown on sapphire substrate, Nature Materials, 2022, vol. 21, p. 740-747.
(Continued)

*Primary Examiner* — David J Makiya
*Assistant Examiner* — Soorena Kefayati
(74) *Attorney, Agent, or Firm* — Idea Intellectual Limited; Sam T. Yip (57) ABSTRACT

Visible and infrared radiation photothermoelectric effect photodetectors are provided. The photodetectors are formed on substrates having a low thermal diffusivity of less than 0.05 mm²/sec. A thermoelectric metal chalcogenide film is formed on the low thermal diffusivity substrate. At least two symmetric electrodes are formed on the thermoelectric metal chalcogenide film such that the thermoelectric metal chalcogenide film forms a channel between the electrodes. The photodetector has a responsivity of at least approximately 65 V W−1 for 1550 nm illumination and a response time less than approximately ~60 ms. The photodetector photoresponse is tunable via manipulation of local illumination. Examples of photodetectors use $Bi_2Se_3$, $Bi_2Te_3$, and $SnSe_2$ on flexible polymeric substrates. By using large-area thermoelectric films with a photothermal detection mechanism, and modulating responsivity via thermal coupling, photodetector arrays for wearable electronics and integrated optoelectronic circuits may be created.

17 Claims, 8 Drawing Sheets

(58) Field of Classification Search
CPC ...... H10N 10/853; H10N 10/81; H10N 10/82; H10N 10/851; H10N 10/855; H10N 10/857; G01J 5/12; G01J 5/046; G01J 5/024; G01J 5/0853; G01J 5/023; G01J 5/022; G01J 5/16; G01J 5/03; G01J 5/045; G01J 5/06; G01J 5/068; G01J 5/14; G01J 5/20; G01J 5/34; G01J 2005/126; G01J 2005/123

See application file for complete search history.

(56) References Cited

U.S. PATENT DOCUMENTS

| | | | | |
|---|---|---|---|---|
| 2012/0104325 | A1* | 5/2012 | Talapin | C01B 19/002 423/511 |
| 2012/0247524 | A1* | 10/2012 | Rolison | H10N 10/852 136/238 |
| 2014/0299772 | A1* | 10/2014 | Guyot-Sionnest | H10F 77/127 257/431 |
| 2018/0013020 | A1* | 1/2018 | Choi | H10F 77/244 |
| 2018/0097468 | A1* | 4/2018 | Hsiao | H10N 10/17 |
| 2018/0233646 | A1* | 8/2018 | Morelli | C04B 35/62605 |
| 2019/0035995 | A1* | 1/2019 | Cho | H10N 10/17 |
| 2019/0181323 | A1* | 6/2019 | Lee | H10N 10/17 |
| 2019/0194797 | A1* | 6/2019 | Yu | C30B 29/46 |
| 2019/0378716 | A1* | 12/2019 | Min | C23C 16/45525 |
| 2020/0287116 | A1* | 9/2020 | Kim | H10N 10/8556 |
| 2021/0210648 | A1* | 7/2021 | Joselevich | H01L 21/02433 |
| 2022/0085225 | A1* | 3/2022 | Guyot-Sionnest | H10F 77/1433 |
| 2022/0093811 | A1* | 3/2022 | Hermes | H10F 77/50 |
| 2022/0149946 | A1* | 5/2022 | Ferrari | H04B 10/40 |
| 2022/0236113 | A1* | 7/2022 | Goldstein | G01J 5/34 |

OTHER PUBLICATIONS

Chunsong Zhao et al., Evaporated tellurium thin films for p-type field-effect transistors and circuits, Nature Nanotechnology, 2020, vol. 15, p. 53-58.

Zehan Wu et al, Large-scale growth of few-layer two-dimensional black phosphorus, Nature Materials, 2021, vol. 20, p. 1203-1209.

Kenji Nomura et al., Thin-Film Transistor Fabricated in Single-Crystalline Transparent Oxide Semiconductor, Science, 2003, vol. 300, p. 1269-1272.

Myung-Gil Kim et al., Low-temperature fabrication of high-performance metal oxide thin-film electronics via combustion processing, Nature Materials, 2011, vol. 10, p. 382-388.

Sangmoon Park et al., Low-Temperature Thin-Film Deposition and Crystallizationn, Science, 2002, vol. 297, p. 65.

Chunsong Zhao et al., Tellurium Single-Crystal Arrays by Low-Temperature Evaporation and Crystallization, Advanced Materials, 2021, 2100860, p. 1-9.

Sungjun Park et al., Self-powered ultra-flexible electronics via nano-grating-patterned organic photovoltaics, Nature, 2018, vol. 561, p. 516-521.

Max M. Shulaker et al., Three-dimensional integration of nanotechnologies for computing and data storage on a single chip, Nature, 2017, vol. 547, p. 74-78.

Hiroaki Jinno et al., Stretchable and waterproof elastomer-coated organic photovoltaics for washable electronic textile applications, Nature Energy, 2017, vol. 2, p. 780-785.

Hans J. Queisser et al., Defects in Semiconductors: Some Fatal, Some Vital, Science, 1998, vol. 281, p. 945-950.

Yang Lu et al., Controlling Defects in Continuous 2D GaS Films for High-Performance Wavelength-Tunable UV-Discriminating Photodetectors, Advanced Materials, 2020, vol. 32, 1906958, p. 1-12.

Fangzhou Li et al., Crystalline InGaZnO quaternary nanowires with superlattice structure for high-performance thin-film transistors, Nano Research, 2019, vol. 12, p. 1796-1803.

Xiangfan Xu et al., Thermal Conductivity of Polymers and Their Nanocomposites, Advanced Materials, 2018, vol. 30, 1705544, p. 1-10.

Asir Intisar Khan et al., Ultralow-switching current density multilevel phase-change memory on a flexible substrate, Science, 2021, vol. 373, p. 1243-1247.

Xiaowei Lu et al., Progress of Photodetectors Based on the Photothermoelectric Effect, Advanced Materials, 2019, vol. 31, 1902044, p. 1-26.

Nathaniel M. Gabor et al., Hot Carrier-Assisted Intrinsic Photoresponse in Graphene, Science, 2011, vol. 334, p. 648-652.

Xinghan Cai et al., Sensitive room-temperature terahertz detection via the photothermoelectric effect in graphene, Nature Nanotechnology, 2014, vol. 9, p. 814-819.

Leonardo Viti et al., Black Phosphorus Terahertz Photodetectors, Advanced Materials, 2015, vol. 27, p. 5567-5572.

Kelly W. Mauser et al., Resonant thermoelectric nanophotonics, Nature Nanotechnology, 2017, vol. 12, p. 770-775.

M. Badioli et al., Phonon-Mediated Mid-Infrared Photoresponse of Graphene, Nano Letters, 2014, vol. 14, p. 6374-6381.

Ping Fan et al., High-performance bismuth telluride thermoelectric thin films fabricated by using the two-step single- source thermal evaporation, Journal of Alloys and Compounds, 2020, vol. 819, 153027, p. 1-7.

Tae-Hyeon Kim et al., Tuning the Fermi level with topological phase transition by internal strain in a topological insulator Bi2Se3 thin film, Nanoscale, 2016, vol. 8, p. 741-751.

Desheng Kong et al., Rapid Surface Oxidation as a Source of Surface Degradation Factor for Bi2Se3, ACS Nano, 2011, vol. 5, No. 6, p. 4698-4703.

Xianli Su et al., Self-propagating high-temperature synthesis for compound thermoelectrics and new criterion for combustion processing, Nature Communications, 2014, vol. 5, 4908, p. 1-7.

Gang Zheng et al., High thermoelectric performance of mechanically robust n-type Bi2Te3-xSex prepared by combustion synthesis, Journal of Materials Chemistry A, 2015, vol. 3, p. 6603-6613.

Jiefei Fu et al., Understanding the combustion process for the synthesis of mechanically robust SnSe thermoelectrics, Nano Energy, 2018, vol. 44, p. 53-62.

Tao Liang et al., Ultra-fast non-equilibrium synthesis and phase segregation in InxSn1-xTe thermoelectrics by SHS-PAS processing, Journal of Materials Chemistry C, 2015, vol. 3, p. 8550-8558.

Xiaoming Tan et al., New criteria for the applicability of combustion synthesis: The investigation of thermodynamic and kinetic processes for binary Chemical Reactions, Journal of Alloys and Compounds, 2021, vol. 860, 158465, p. 1-7.

S.N. Kundu et al., Synthesis of CuInSe2 films by rapid thermal processing of stacked elemental layers, Materials Chemistry and Physics, 1999, vol. 57, p. 207-213.

Xiaowei Lu et al., Phonon-enhanced photothermoelectric effect in SrTiO3 ultra-broadband photodetector, Nature Communications, 2019, vol. 10, 138, p. 1-7.

Qun Jin et al., Flexible layer-structured Bi2Te3 thermoelectric on a carbon nanotube scaffold, Nature Materials, 2019, vol. 18, p. 62-68.

Qingyu Yang et al., Flexible thermoelectrics based on ductile semiconductors, Science, 2022, vol. 377, p. 854-858.

Sun Jin Kim et al., High-Performance Flexible Thermoelectric Power Generator Using Laser Multiscanning Lift-Off Process, ACS Nano, 2016, vol. 10, p. 10851-10857.

Michele Buscema et al., Large and Tunable Photothermoelectric Effect in Single-Layer MoS2, Nano Letters, 2013, vol. 13, p. 358-363.

Yu Liu et al., High-Performance Ultrabroadband Photodetector Based on Photothermoelectric Effect, ACS Applied Materials Interfaces, 2022, vol. 14, p. 29077-29086.

Rui Wang et al., Manipulating Nanowire Structures for an Enhanced Broad-Band Flexible Photothermoelectric Photodetector, Nano Letters, 2022, vol. 22, p. 5929-5935.

Yuan Yan et al., Topological Surface State Enhanced Photothermoelectric Effect in Bi2Se3 Nanoribbons, Nano Letters, 2014, vol. 14, p. 4389-4394.

(56) References Cited

OTHER PUBLICATIONS

Xiaowei He et al., Photothermoelectric p - n Junction Photodetector with Intrinsic Broadband Polarimetry Based on Macroscopic Carbon Nanotube Films, ACS Nano, 2013, vol. 7, No. 8, p. 7271-7277.
T. J. Echtermeyer et al., Photothermoelectric and Photoelectric Contributions to Light Detection in Metal-Graphene- Metal Photodetectors, Nano Letters, 2014, vol. 14, p. 3733-3742.
Bocheng Lv et al., Local large temperature difference and ultra-wideband photothermoelectric response of the silver nanostructure film/carbon nanotube film heterostructure, Nature Communications, 2022, vol. 13, 1835, p. 1-9.
Mingyu Zhang et al., Large-Area and Broadband Thermoelectric Infrared Detection in a Carbon Nanotube Black-Body Absorber, ACS Nano, 2019, vol. 13, p. 13285-13292.
Mingjin Dai et al., High-Performance, Polarization-Sensitive, Long-Wave Infrared Photodetection via Photothermoelectric Effect with Asymmetric van der Waals Contacts, ACS Nano, 2022, vol. 16, p. 295-305.
Gang Li et al., Fast Photothermoelectric Response in CVD-Grown PdSe2 Photodetectors with In-Plane Anisotropy, Advanced Functional Materials, 2021, vol. 31, 2104787, p. 1-7.
Jiawei Lai et al., Anisotropic Broadband Photoresponse of Layered Type-II Weyl Semimetal MoTe2, Advanced Materials, 2018, vol. 30, 1707152, p. 1-7.
Yuejiao Shu et al., Modification of Bulk Heterojunction and Cl Doping for High-Performance Thermoelectric SnSe2/SnSe Nanocomposites, ACS Applied Materials & Interfaces, 2018, vol. 10, p. 15793-15802.
G. Kresse et al., Efficiency of ab-initio total energy calculations for metals and semiconductors using a plane-wave basis set, Computational Materials Science, 1996, vol. 6, p. 15-50.
G. Kresse et al., Efficient iterative schemes for ab initio total-energy calculations using a plane-wave basis set, Physical Review B, 1996, vol. 54, No. 16, p. 11169-11186.
P. E. Blochl, Projector augmented-wave method, Physical Review B, 1994, vol. 50, No. 24, p. 17953-17979.
John P. Perdew et al., Generalized Gradient Approximation Made Simple, Physical Review Letters, 1996, vol. 77, No. 18, p. 3865-3868.
Graeme Henkelman et al., A climbing image nudged elastic band method for finding saddle points and minimum energy paths, Journal of Chemical Physics, 2000, vol. 113, No. 22, p. 9901-9904.
Yan Wang et al., Near-Infrared Annihilation of Conductive Filaments in Quasiplane MoSe2/Bi2Se3 Nanosheets for Mimicking Heterosynaptic Plasticity, Small, 2019, vol. 15, 1805431, p. 1-12.
Yuliang He et al., The structure and properties of nanosize crystalline silicon films, Journal of Applied Physics, 1994, vol. 75, No. 2, p. 797-803.
W. Richter et al., A Raman and Far-Infrared Investigation of Phonons in the Rhombohedral V2-VI3 Compounds Bi2Te3, Bi2Se3, Sb2Te3 and Bi2(Te1-xSex)3 (0<x<1), (Bi1-ySby)2Te3 (0<y<1), Phys. Status Solidi B, 1977, vol. 84, p. 619-628.
Jun Zhang et al. Raman Spectroscopy of Few-Quintuple Layer Topological Insulator Bi2Se3 Nanoplatelets, Nano Letters, 2011, vol. 11, p. 2407-2414.
P. Brätter et al., Self-Diffusion in Selenium, Phys. Status Solidi B, 1970, vol. 37, p. 869-878.
Christopher E. Shuck et al., Solid-flame: Experimental validation, Combustion and Flame, 2016, vol. 163, p. 487-493.
Gregory M. Fritz et al., Characterizing solid-state ignition of runaway chemical reactions in Ni—Al nanoscale multilayers under uniform heating, Journal of Applied Physics, 2015, vol. 118, 135101, p. 1-8.
T. Neuhauser et al., The role of two-stage phase formation for the solid-state runaway reaction in Al/Ni reactive multilayers, Applied Physics Letters, 2020, vol. 117, 011902, p. 1-5.
Alexander S. Mukasyan et al., The Solid Flame Phenomenon: A Novel Perspective, Advanced Engineering Materials, 2018, vol. 20, 1701065, p. 1-9.
Swapankumar Ghosh et al., Growth of monodisperse nanocrystals of cerium oxide during synthesis and annealing, J. Nanopart. Res., 2009, vol. 12, p. 1905-1911.
R.L. Doiphode et al., Grain growth in calibre rolled Mg—3Al—1Zn alloy and its effect on hardness, Journal of Magnesium and Alloys, 2015, vol. 3, p. 322-329.
Xiaolong Xu et al., Seeded 2D epitaxy of large-area single-crystal films of the van der Waals semiconductor 2H MoTe2, Science, 2021, vol. 372, p. 195-200 .
Junko Morikawa et al., Thermal diffusivity of aromatic polyimide thin films by temperature wave analysis, Journal Applied Physics, 2009, vol. 105, 113506, p. 1-9.
Junko Morikawa et al., Study on thermal diffusivity of poly(ethylene terephthalate) and poly(ethylene naphthalate), Polymer, 1997, vol. 38, No. 21, p. 5397-5400.
V. Stancu et al., Influences of Dispersions' Shapes and Processing in Magnetic Field on Thermal Conductibility of PDMS-Fe3O4 Composites, Materials, 2021, vol. 14, 3696, p. 1-12.
Eduardo J. H. Lee et al., Contact and edge effects in graphene devices, Nature Nanotechnology, 2008, vol. 3, p. 486-490.
Michael Engel et al., Black Phosphorus Photodetector for Multispectral, High-Resolution Imaging, Nano Letters, 2014, vol. 14, p. 6414-6417.
Qinsheng Wang et al., Ultrafast Broadband Photodetectors Based on Three-Dimensional Dirac Semimetal Cd3As2, Nano Letters, 2017, vol. 17, p. 834-841.

\* cited by examiner

WIDE-BAND PHOTODETECTORS USING THERMOELECTRIC MATERIALS

FIELD OF THE INVENTION

This present invention relates to photodetectors, and, more particularly, to photodetectors that use the photothermoelectric effect. Light incident on the thermoelectric materials creates self-powered, wide-band and response switchable photodetectors.

BACKGROUND

Recent decades have witnessed tremendous progress in photodetectors ranging from visible to infrared (IR) optical communication bands. Effective detection of wide spectra regardless of the band structure matching is promising yet challenging since a typical photoresponse based on the photoconductive effect and the photovoltaic effect depends on the generation of electron-hole pairs separated by either built-in electric fields or by an external bias. Therefore, the spectral response is largely limited by the bandgap of active materials. To tackle the wavelength selectivity and achieve a wide-spectral response, especially in the IR range, strategies such as narrow-bandgap semiconductors, quantum wells, and hybrid structures have been evaluated. Nevertheless, these materials suffer from a large dark current, which necessitates cryogenic cooling systems or complex procedures to suppress the dark current. Complex configurations also pose significant obstacles to developing wide-spectral photodetectors that can be flexibly integrated on-chip.

The photothermoelectric effect combines two processes: photothermal conversion and the Seebeck effect. In photothermal conversion, lattice phonons absorb photon energy and transfer the energy to carriers via electron-phonon interactions, leading to a temperature difference and the generation of hot carriers. For the Seebeck effect, the temperature gradient drives the diffusion of hot carriers and produces a photovoltage (Vph) which can be described by the equation $V\_PTE = \int S \cdot \nabla T(x) dx$, where $\nabla T(x)$ is the temperature gradient and $S$ is the Seebeck coefficient which is strongly related to the density of states near the Fermi level. Due to its thermal-related mechanism. PTE detectors are capable of wide-band detection. However, in order to achieve high-performance PTE detectors, both the use of a thermoelectric film and large temperature gradient within the device are required. This has been difficult to achieve in conventional photothermoelectric effect devices.

Proposed devices have formed thin films of thermoelectric materials on substrates; however, most proposed devices have mediocre properties or are prototypes based in materials that are difficult to fabricate and not robust (for example, flakes, individual wires, etc.). For commercial applications, large-scale thin film fabrication is required on a variety of substrates. Scalable thin film deposition techniques, including chemical (physical) vapor deposition and solution-processed coating, have been developed to produce amorphous or nanocrystalline films. However, additional high-temperature processing steps (typically above 400° C.) are necessary when crystalline films are required. This requirement can pose significant challenges in achieving desirable features of crystalline films while working with thermally unstable substrates and other device components. In particular, polymeric substrates, which are extensively used in flexible electronics, are heat-intolerant and atomically disordered, rendering them incompatible with high-temperature treatment and high-quality material growth. Consequently, the performance of electronic devices fabricated on such substrates is frequently compromised by the presence of inferior crystallinity and lattice defects. Thus, there is a pressing demand for thin-film processing methods that enables direct low-temperature deposition while still providing high-quality thermoelectric characteristics for creating broadband photodetectors based on the photothermoelectric effect.

SUMMARY OF THE INVENTION

Photodetectors based on thermoelectric materials are formed on substrates with low thermal diffusivity to realize wide-band and switchable photodetection via the photothermoelectric (PTE) effect are provided. Specifically, thermoelectric alloy films with thermoelectric properties are fabricated via sequential elemental evaporation on low high thermal diffusivity substrates followed by subsequent annealing. A device may be configured as a two-terminal structure with a channel defined between the two terminals. Due to the Seebeck effect of the thermoelectric film, any light that can generate a heat effect can induce a temperature gradient in the device channel, thus leading to a wide-band detection from visible to near infrared (NIR) spectral range.

A wide-band photodetector based on the photothermoelectric effect is provided using metal chalcogenides, such as $Bi_2Se_3$, as a thermoelectric material. Starting from alternately stacked layers (bismuth and selenium layers) via thermal evaporation, rapid thermal annealing promotes the alloying of elemental layers. The alloying temperature can be lowered to 100-200° C., compatible with most flexible substrates, forming a photodetector film with ultrathin, mechanically conformable features. The principle of the photothermoelectric effect creates a powerful platform for transferring the information wide-band optical signals (from 405 to 1550 nm and potentially for ultra-broad range beyond terahertz) to an electrical readout. The synergistic effect of thermal coupling and the photothermoelectric effect provides high-performance, wide-spectrum detection.

In one aspect, the present invention provides a visible and infrared radiation photothermoelectric effect photodetector. The photodetector is formed on a substrate having a low thermal diffusivity of less than 0.05 mm$^2$/sec. A thermoelectric metal chalcogenide film is formed on the low thermal diffusivity substrate. The thermoelectric metal chalcogenide film has a Seebeck coefficient of at least 180 micro-V/K. At least two symmetric electrodes are formed on the thermoelectric metal chalcogenide film such that the thermoelectric metal chalcogenide film forms a channel between the electrodes. The photodetector has a responsivity of at least approximately 65 V W−1 for 1550 nm illumination and a response time less than approximately ~60 ms. The photodetector photoresponse is tunable via manipulation of local illumination.

The thermoelectric metal chalcogenide film may be a metal selected from one or more of bismuth, lead, thallium, or antimony and a chalcogen selected from one or more of tellurium or selenium.

The thermoelectric metal chalcogenide film may be $Bi_2Se_3$.

The thermoelectric metal chalcogenide film may be $Bi_2Te_3$,

The at least two symmetric electrodes may be metallic electrodes.

The low thermal diffusivity substrate may be a polymer.

The polymer may be polyimide, polycarbonate, polystyrene, polyethylene terephthalate, polyester, polyamide, nylon, or mixtures thereof.

In a further aspect, a method of making the visible and infrared radiation photothermoelectric effect photodetector is provided. A substrate is provided having a low thermal diffusivity of less than 0.05 mm$^2$/sec. A thermoelectric metal chalcogenide film is formed on the low thermal diffusivity substrate. The thermoelectric metal chalcogenide film has a Seebeck coefficient of at least 180 micro-V/K. The process includes depositing one or more chalcogen layers on the low thermal diffusivity substrate followed by depositing one or more metal layers on the chalcogen layer. A rapid thermal anneal of the one or more chalcogen layers and the one or more metal layers is performed to form the thermoelectric metal chalcogenide film.

At least two symmetric electrodes are formed on the thermoelectric metal chalcogenide film such that the thermoelectric metal chalcogenide film forms a channel between the at least two symmetric electrodes.

The thermoelectric metal chalcogenide film may have a metal selected from one or more of bismuth, lead, thallium, or antimony and a chalcogen selected from one or more of tellurium or selenium.

The thermoelectric metal chalcogenide film may be $Bi_2Se_3$.

The thermoelectric metal chalcogenide film may be $Bi_2Te_3$.

The at least two symmetric electrodes may be metallic electrodes.

The low thermal diffusivity substrate may be a polymer.

The polymer may be polyimide, polycarbonate, polystyrene, polyethylene terephthalate, polyester, polyamide, nylon, or mixtures thereof.

DETAILED DESCRIPTION

The present invention provides wide-band photodetectors based on the photothermoelectric effect. The photodetectors include thin metal chalcogenide layer on low thermal diffusivity substrates. Thermal diffusivity is the thermal conductivity of a substance divided by the product of its density and its specific heat capacity. The present inventors determined that through controlled formation of thermoelectric materials on substrates having a low thermal diffusivity, wide-band and switchable photodetectors may be fabricated. The thermal coupling between the thermoelectric films and the low thermal diffusivity substrates plays a crucial role in photoresponsivity: a substrate with a lower thermal diffusivity results in a larger temperature gradient across a photodetector channel. In particular, the discovery of a synergistic thermal effect between low thermal diffusivity polymeric substrates and thermoelectric films results in photodetectors with wide-band detection capability.

Thermoelectric materials exhibit the Seebeck effect in which a temperature difference between two dissimilar electrical conductors or semiconductors produces a voltage difference between the two substance. Thermoelectric materials are characterized by a large Seebeck coefficient, high electrical conductivity, and low thermal conductivity. The Seebeck coefficient is a measure of the magnitude of the induced thermoelectric voltage in response to a temperature difference across that material. A thermoelectric material may be characterized by a dimensionless figure of merit (zT), $zT=S2\rho-1\kappa-1T$, calculated from the Seebeck coefficient(S), electrical resistivity ($\rho$), and thermal conductivity ($\kappa$).

Although low thermal diffusivity polymeric substrates are often deemed simply as platforms to support device components, the present invention discovered that their thermal properties significantly impact the overall device performance. Unlike solid inorganic materials, polymeric matrixes usually consist of disordered long chains with low crystallinity, giving rise to a thermal insulating characteristic. In this regard, the temperature distribution on polymeric substrates is susceptible to small amounts of energy input. Attempts have been made to improve the responsivity of photothermoelectric detectors utilizing electrical gating, surface plasmonics, antenna coupling, and phonon adsorption. While these techniques may result in a higher temperature gradient or enhanced Seebeck coefficient, these strategies focus on the thermoelectric functional films themselves, with limited exploration of the thermal coupling effect between the selected substrates and the thermoelectric functional films in order to improve device performance.

The use of low thermal diffusivity substrates produces a number of advantages. The most important of these is the enhanced temperature gradient that is produced due to minimizing heat loss through the substrate. As a result, a larger temperature gradient can be created across the thermoelectric chalcogenide film. A higher temperature difference between the hot and cold sides leads to an increased Seebeck coefficient, which results in greater electron flow. In short, low thermal diffusivity substrates, have low thermal conductivity and therefore more heat is retained within the thermoelectric film.

As a result of the above determinations, the present invention provides a visible and infrared radiation photothermoelectric effect photodetector. The photodetector is designed to efficiently detect and convert incoming light into electrical signals as the light heats the thermoelectric material and thus current flows in proportion to the incident light. The photodetector offers improved performance in terms of responsivity and response time compared to existing photodetector technologies.

The photodetector is constructed on a substrate that possesses a low thermal diffusivity, specifically less than 0.05 mm$^2$/sec. This low thermal diffusivity characteristic ensures effective heat management within the device. On this substrate, a thermoelectric metal chalcogenide film is formed. The thermoelectric metal chalcogenide film is crucial to the operation of the photodetector as it enables the conversion of incident light into electrical signals. The film possesses a Seebeck coefficient of at least 180 micro-V/K, which ensures efficient conversion of thermal gradients into voltage.

To create the desired functionality, at least two symmetric electrodes are formed on the thermoelectric metal chalcogenide film. These metallic electrodes are strategically positioned to create a channel within the film, which allows the efficient flow of electrical current. The photodetector's unique design and configuration ensure optimal detection and conversion of light.

The photodetector exhibits exceptional performance characteristics. It demonstrates a responsivity of at least approximately 65 V W−1 when illuminated with light at a wavelength of 1550 nm. This high responsivity enables accurate detection and conversion of light signals. Furthermore, the photodetector exhibits a rapid response time, taking less than approximately 60 ms to register changes in incident light intensity.

An important feature of the photodetector is its tunable photoresponse. By manipulating the local illumination conditions, the sensitivity and behavior of the photodetector can be adjusted accordingly. This tunability offers versatility and adaptability in various applications and environments.

The thermoelectric metal chalcogenide film can be composed of different metals and chalcogens. In one embodiment, the film may consist of bismuth, lead, thallium, or antimony as the metal component, combined with tellurium or selenium as the chalcogen component. Specifically, the film may be $Bi_2Se_3$ or $Bi_2Te_3$, providing excellent thermoelectric properties for efficient energy conversion. Other examples of metal chalcogenide films that may be used in the present invention include: $SnTe_2$ $SnSe_2$, $Sb_2Te_3$, $Bi_{0.5}Sb_{1.5}Te_3$, $Ag_2Se$ as well as off-stoichiometric and doped versions of these materials (for example, dopants of Sn, Pb, Pd, In, W). Ternary metal chalcogenides (for example, using oxygen, bismuth, and selenium) are also possible. However, other materials may also be used depending upon the target wavelength range of the photodetector (e.g., visible vs. infrared). In general, elements capable of thermal or electron beam evaporation have thermoelectric properties are suitable for use in the present invention.

The symmetric electrodes are constructed using metallic materials, ensuring good electrical conductivity and compatibility with the thermoelectric metal chalcogenide film.

The low thermal diffusivity substrate used in the construction of the photodetector is preferably a polymer material. Examples of suitable polymers include polyimide, polycarbonate, polystyrene, polyethylene terephthalate, polyester, polyamide, nylon, or mixtures thereof. These polymer substrates provide mechanical stability, thermal insulation, and compatibility with the overall device design.

In the manufacturing process of the photodetector, a series of steps are followed. Firstly, a substrate with low thermal diffusivity, meeting the specified criteria, is provided. Then, a thermoelectric metal chalcogenide film is formed on the substrate. This formation involves depositing one or more chalcogen layers onto the substrate, followed by the deposition of one or more metal layers onto the chalcogen layer. Subsequently, a rapid thermal anneal process is performed, causing the chalcogen and metal layers to react and form the desired thermoelectric metal chalcogenide film. Finally, at least two symmetric electrodes are formed on the thermoelectric metal chalcogenide film, creating the necessary channel for efficient electrical current flow.

The method of manufacturing allows for flexibility in the selection of the thermoelectric metal chalcogenide film composition, as described in the claims. The resulting photodetector exhibits high-performance characteristics and can be produced reliably and cost-effectively.

The visible and infrared radiation photothermoelectric effect photodetector presented in this invention offers improved responsivity, response time, and tunable photoresponse. Its construction on a low thermal diffusivity substrate, incorporation of a thermoelectric metal chalcogenide film, and the presence of symmetric electrodes enable efficient detection and conversion of incoming light signals. The photodetector has diverse applications in areas such as imaging, sensing, and optical communication systems.

Figure 1:
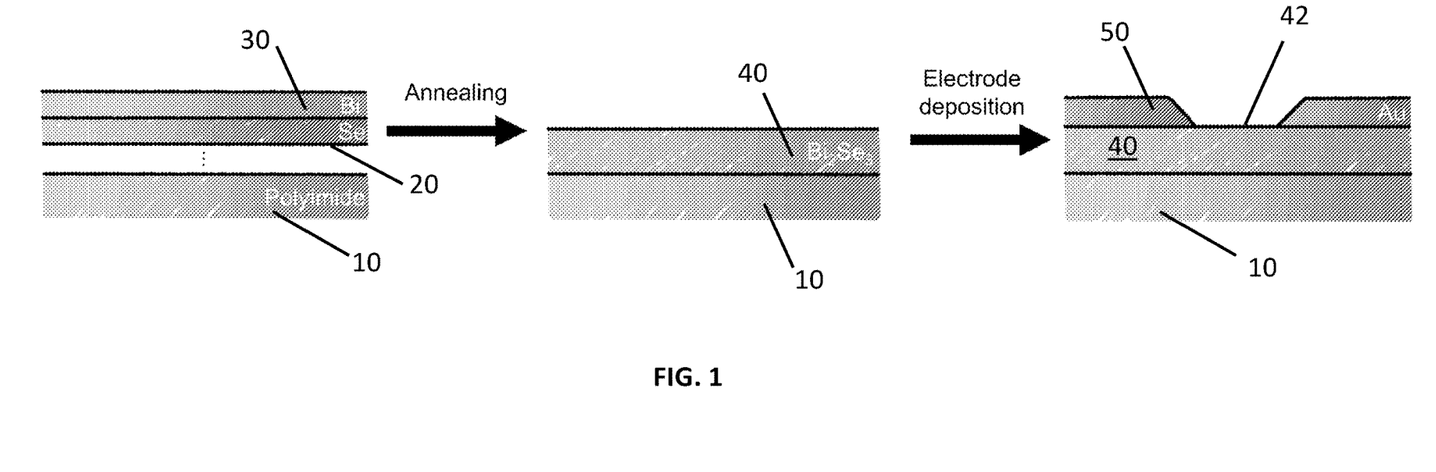
FIG. 1 shows a schematic diagram of the fabrication process of a $Bi_2Se_3$ film.

Turning to the drawings in detail. FIG. 1 depicts the formation of a thermoelectric material on a low thermal diffusivity substrate. In the following description, the thermoelectric film is $Bi_2Se_3$ while the substrate is a flexible polymer such as polyimide; however, it is understood that this disclosure applies equally to other thermoelectric materials on other substrates. In FIG. 1, a chalcogen layer 20 of a metal chalcogenide is deposited on a polyimide substrate 10 by evaporation. Evaporation may be by thermal or e-beam evaporation in which the source material is loaded in a tungsten boat, which is connected to a precisely controlled power source. The evaporation process is conducted in an ultra-high vacuum chamber (on the order of $10^{-7}$ Torr). The metal constituent of the metal chalcogenide is deposited as layer 30 over the chalcogen layer 20.

Annealing between 100-200° C. is performed in order to form the metal chalcogenide layer 40. In the same vacuum chamber or a separate chamber, metal electrodes 50 may be deposited through a mask to form a pattern, leaving a bridge of metal chalcogenide between the electrodes.

Alternatively, the $Bi_2Se_3$ film may be prepared by forming elemental layers with a subsequent rapid thermal anneal, such as a pulse irradiation synthesis. Rapid thermal annealing (RTA) is a technique used to promote mixing of thin film layers deposited on substrates. It involves subjecting the thin film structure to a high-temperature heat treatment for a short duration of time. In this manner, atomic diffusion and intermixing between different layers of the thin film stack occurs without substrate damage. The temperature of the thin film stack is rapidly increased to the annealing temperature. Due to the rapid ramping to the annealing temperature and short duration of annealing, temperature-sensitive substrates may be used without being damaged. Rapid thermal annealing may be performed using tungsten-halogen lamps, arc lamps, or lasers that can provide intense heat in a short period of time, typically on the order of seconds. Further, rapid thermal annealing may be used to control crystallization of grain growth to create a thin film morphology optimized for enhancing the thermoelectric effect of the metal chalcogenide film.

The chalcogen layer 20 (selenium (Se) in this embodiment) and metal layer 30 (bismuth (Bi) in this embodiment) may be sequentially deposited in an ultra-high vacuum physical vapor deposition chamber on polyimide substrate 10. The metal layer 30 is deposited over the chalcogen layer 20 to prevent chalcogen loss during the rapid annealing. High-intensity radiation generated from a tungsten halogen lamp heats the sample, and the temperature rises to a preset point within a few seconds. The precisely controlled temperature system enables fast ramping rates (~100 K s−1) with a heating duration of less than one second. Consequently, the pulse irradiation triggers the interdiffusion between layers, and $Bi_2Se_3$ nucleates and grows into a layered structure. A mass flow of inert gas such as argon is used to prevent the film from possible oxidation. Gold electrodes 50 patterned by a metal mask are deposited on the annealed $Bi_2Se_3$ film 40 via thermal evaporation.

Figure 2A:
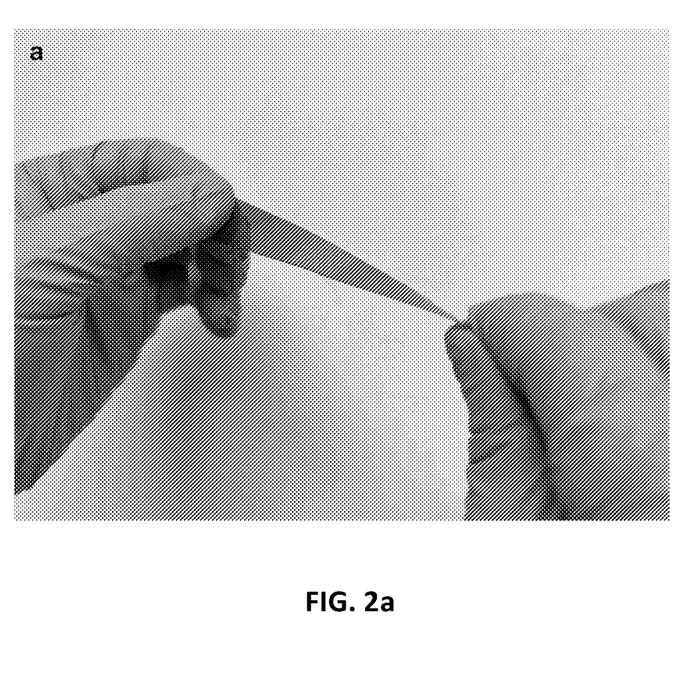
FIGS. 2a-2b show a photograph of a photothermoelectric photodetector array on a twisted polyimide substrate (FIG. 2a) and an optical image of a single photothermoelectric device (FIG. 2b).
Figure 2B:
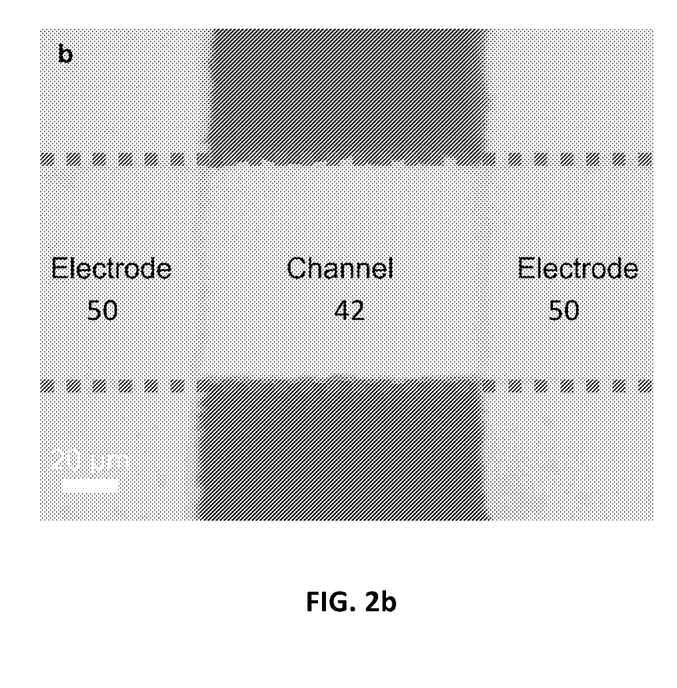

Due to the low temperature deposition and annealing method, the thermoelectric film may be fabricated on flexible substrates, as shown in FIG. 2a in which a thin $Bi_2Se_3$ film has been deposited on a flexible polyimide substrate. A unit device is configured as a two-terminal structure (FIG. 2b). This simple structure facilitates the fabrication of photodetector arrays and integration into other on-chip devices.

Figure 3:
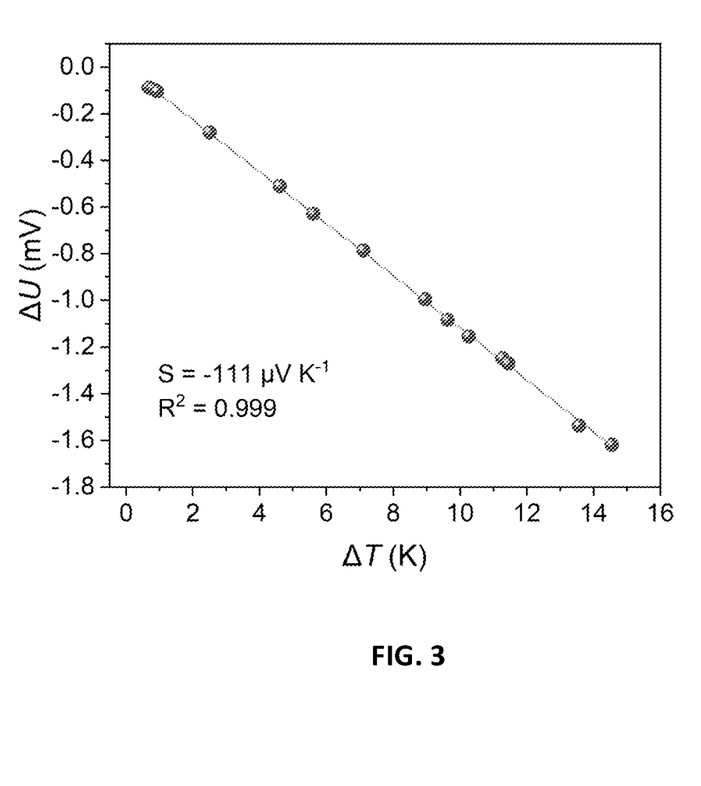
FIG. 3 shows the Seebeck coefficient of a $Bi_2Se_3$ film.

The thermoelectric properties, characterized by the Seebeck coefficient, which shows the ability of a material to convert a temperature difference ($\Delta T$) to an electric potential difference ($\Delta U$) are depicted in FIG. 3. In FIG. 3, the potential difference is linear with the temperature gradient between electrodes. The extracted Seebeck coefficient is $-111$ $\mu V$ $K-1$, with a coefficient of the determination being 0.999. This result is comparable with most thermoelectric materials.

Figure 4A:
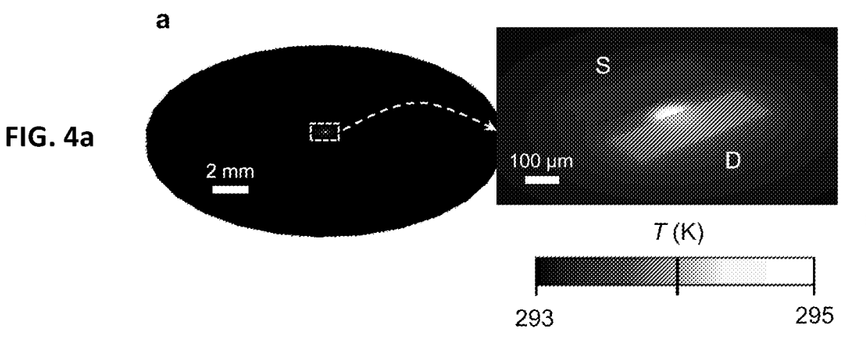
FIGS. 4a-4d show temperature distributions and corresponding line profiles on $SiO_2$ (FIGS. 4a. 4c) and polyimide substrates (FIGS. 4b, 4d).
Figure 4B:
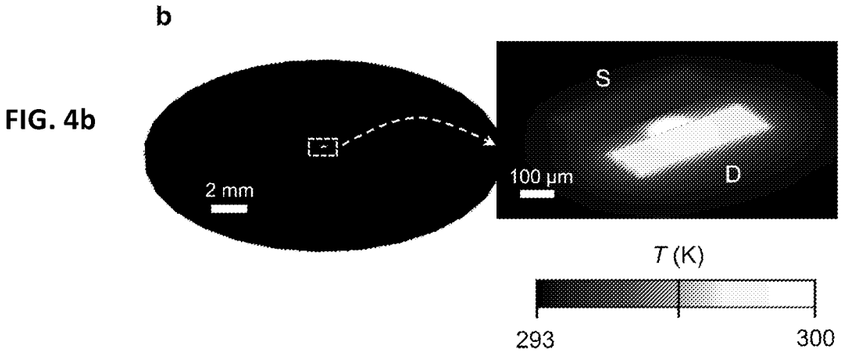
Figure 4C:
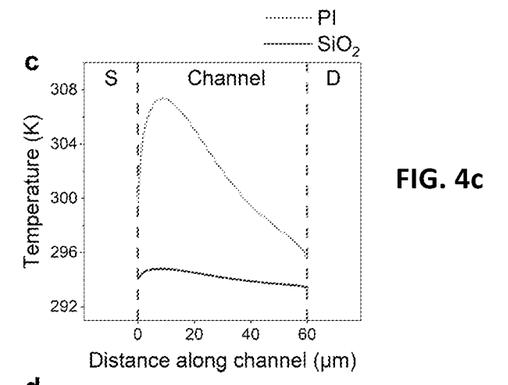
Figure 4D:
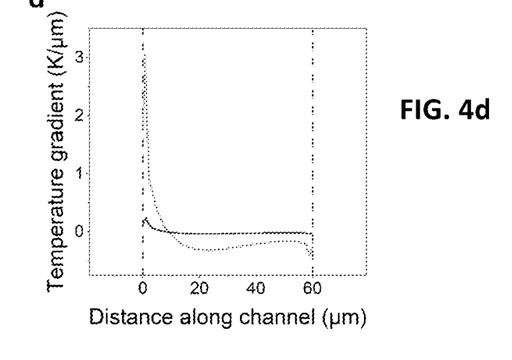

The thermoelectric films of the present invention improve the performance of the photothermoelectric (PTE) effect detector. Apart from the Seebeck coefficient, the larger temperature gradient in the channel due to the use of low thermal diffusivity substrates is also effective to enhance the PTE response. In this regard, a larger thermal coupling between the substrate and the film will increase $\Delta T$ under the same light intensity. Here, it is proposed that the thermal diffusivity (a) of the substrate is the main factor that influences the temperature (T) distribution, which can be described by $\partial T/\partial t - \alpha \nabla^2 T$. The thermal diffusivity quantifies how fast the heat smooths out in the material. We compare PI and $SiO_2$/Si substrates as they have a large difference in thermal diffusivity (0.21 and 0.87 mm2 s–1 for PI and $SiO_2$, respectively). When the device is illuminated by a laser, a heat influx is created at the source electrode. FIGS. 4a and b illustrate the simulated temperature distribution, which is achieved by the finite-element modeling with the COMSOL software. Due to the large difference in a, line profiles of temperature distribution on PI and $SiO_2$ in FIG. 4c lead to gradients of $-0.317$ and $-0.036$ K $\mu$m$-1$ on PI and $SiO_2$/Si, respectively (FIG. 4d). Hence, in a material with high thermal diffusivity, heat moves rapidly because of the fast heat conduction compared to its volumetric heat capacity. This results in a lower temperature gradient on the surface. From the results in FIGS. 4a-4d, using a substrate with low thermal diffusivity is highly efficient in obtaining a larger temperature gradient in the device's channel on the film.

Figure 5A:
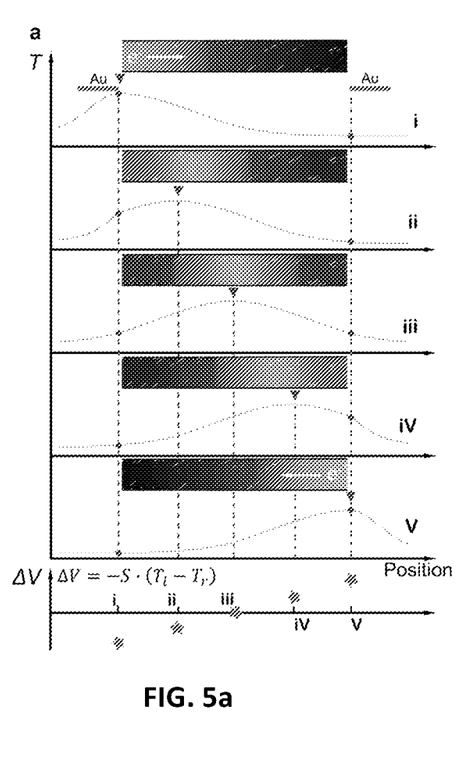
FIGS. 5a-5c shows a schematic mechanism of the photothermoelectric photodetector (FIG. 5a), and photovoltage mapping on the device (FIGS. 5b, 5c).
Figure 5B:
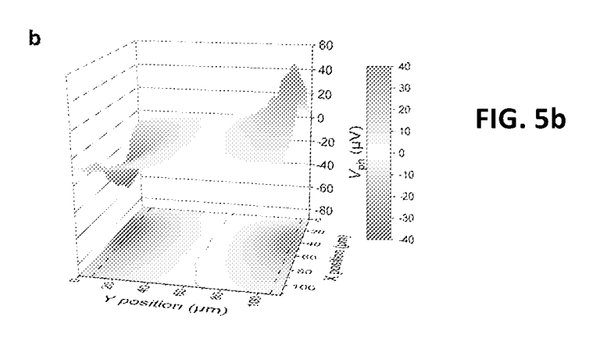
Figure 5C:
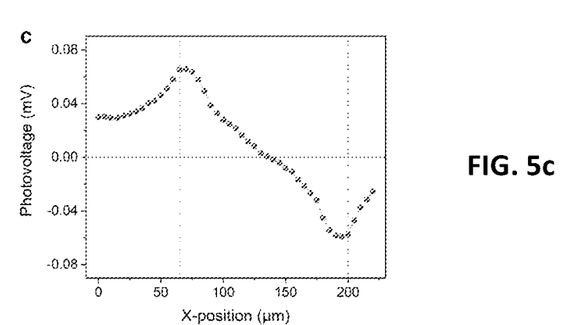

The mechanism of the switchable photoresponse of PTE effect is briefly illustrated in FIG. 5a. The temperature distribution varies as the incident light illumination position changes. In the embodiment of FIG. 5a, the incident light is a laser. When the laser focuses on the left electrode, the largest temperature gradient is built up in the channel, which drives the diffusion of electrons from the warm side to the cold side (the major carriers in $Bi_2Se_3$ are electrons). On a macro scale, a negative electrical potential is observed from the cold side to the warm side (the direction from left to right is defined as positive). When the laser position shifts from the left side to the right side (FIG. 5a), the temperature gradient between the two electrodes descends and switches direction when crossing the middle line of the channel. Therefore, this location-dependent photoresponse holds potentials for light tracing or night surveillance. In FIG. 5b, a scanning photovoltage mapping (SPVM) exhibits an opposite sign of Vph at two sides of the device with a value of $\pm 50$ $\mu V$. The response is symmetrical around the device's center and there is a zero Vph crossover around the center area between the source and drain electrodes (FIG. 5c).

Figure 6A:
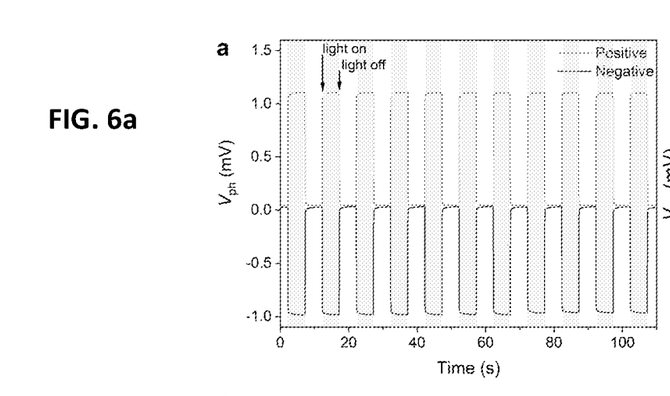
FIGS. 6a-6d show the positive and negative temporal response of the photothermoelectric detector (FIG. 6a), temporal responses (FIG. 6b) and I-V curves (FIG. 6c) under increasing light power, and the responsivity under 1550 nm illumination (FIG. 6d).
Figure 6B:
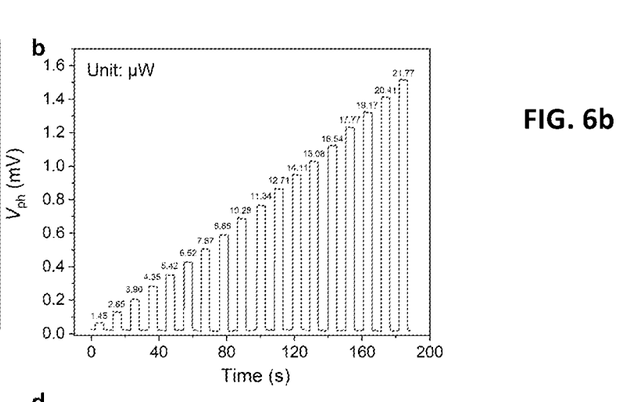
Figure 6C:
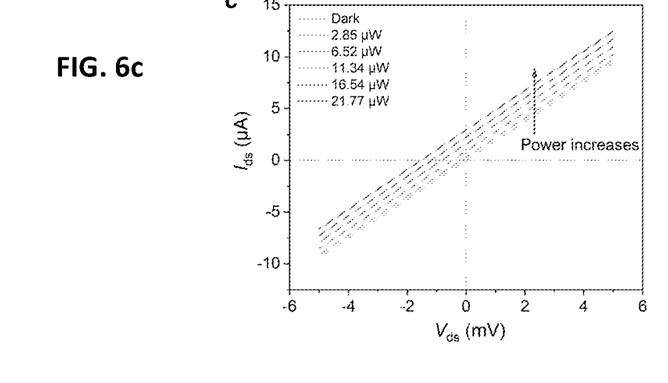
Figure 6D:
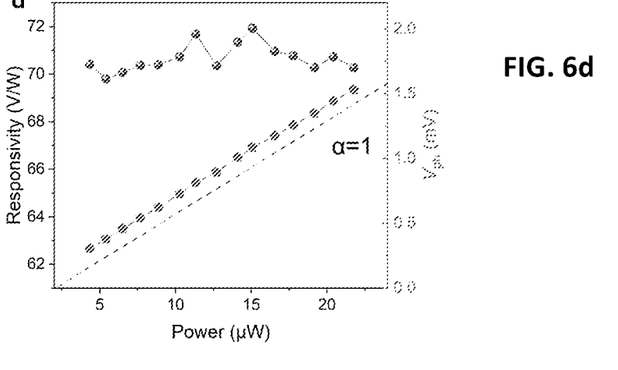

In the photodetection test, the temporal Vph exhibits equal but opposite responses when the 1550 nm laser illuminates two ends of the channel (FIG. 6a). The rapid and reproducible response under multiple switches indicates good stability in near-infrared detection, with a high on/off ratio of ~102. From the temporal response and I-V curve under increasing light power (FIGS. 6b and 6c), the Vph is proportional to the laser intensity as the light power P is increased. This linear relationship between P and Vph can be fitted by the power law equation: "V"_"ph" "∝" "P" ^"α", where the fitted ideal factor $\alpha$ is close to 1. These results rule out the possibility of photoconductive and bolometric effects contributing to photoresponse in this invention. Since the $\Delta T$ is proportional to the light power, the corresponding responsivity (R=Vph/P) remains at the same level with different P and peaks at 71.9 V/W for 1550 nm IR light (FIG. 6d), surpassing most PTE detectors.

Figure 7:
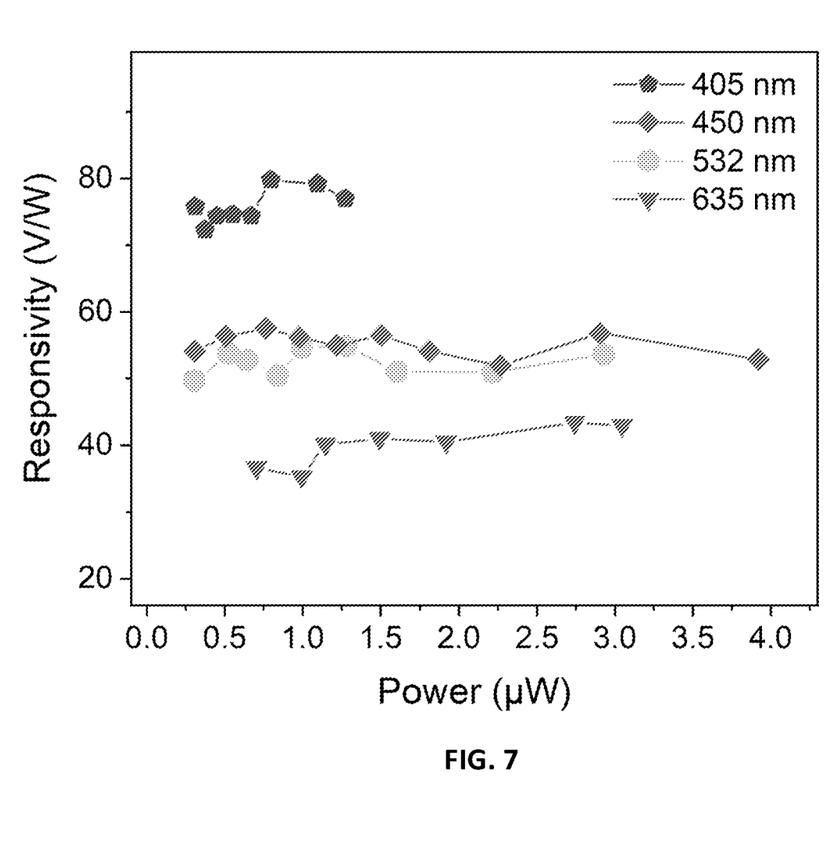
FIG. 7 shows the compiled responsivity R as a function of laser power at the visible range.

Taking advantages of the PTE effect, any light source that generates a heat effect can induce the PTE response via the thermoelectric effect. Consequently, the operation wavelength of the photodetector is not limited by the bandgap of the active film. Performance of the wavelength-independent detection compiled in FIG. 7 shows the responsivity of 75.8, 55.1, 52.4, and 40.0 V W–1 for 405, 450, 532, and 635 nm illuminations. As can be seen, at the visible range, the responsivity is slightly lower than that of near IR laser, probably due to the lower temperature gradient induced by a less significant heating effect of the visible laser.

Figure 8A:
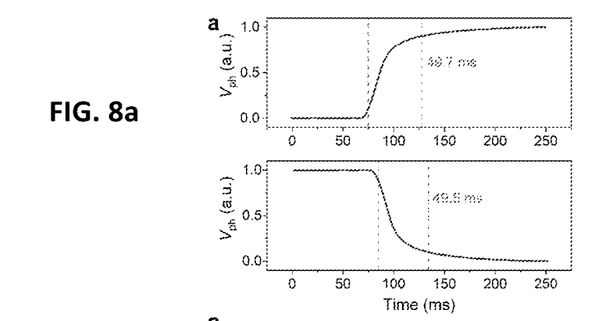
FIGS. 8a-8c show the rise and decay time (FIG. 8a), frequency response (FIG. 8b), and response stability (FIG. 8c) of the photothermoelectric device.
Figure 8B:
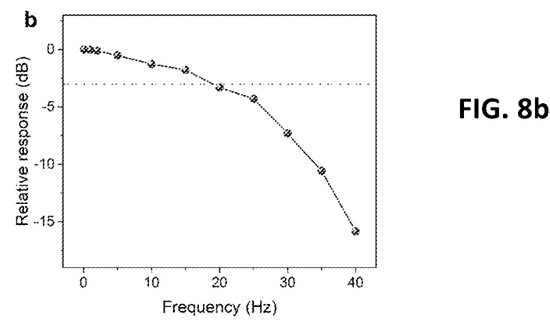
Figure 8C:
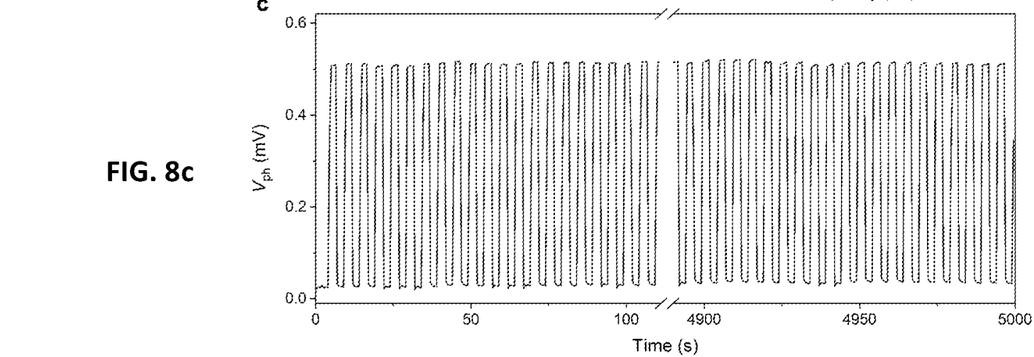

As another important figure-of-merit for photodetectors, the response time in FIG. 8a shows that the rise and decay times are 49.7 and 49.5 ms, respectively. The scale of the response time is mainly based on the PTE effect whose thermal equilibrium rate largely depends on thermal conductivity and heat capacity, and it is generally slower than photovoltaic photodetectors. The frequency response in FIG. 8b presents that the 3 dB cutoff occurs at ~20 Hz under 1550 nm illumination. The response time on the order of milliseconds indicates a temperature-gradient-driven hot-electron diffusion. Owing to the scalable deposition method and the simple device structure, the film PTE-detector of the present invention demonstrates outstanding stability under repeated tests. After 1000 cycles of repeated illumination, there is hardly any discernable degradation of the photovoltage (FIG. 8c).

EXAMPLES

Fabrication of $Bi_2Se_3$ Film

Elemental layers were thermally evaporated on a polyimide substrate in an alternate manner. For the $Bi_2Se_3$ film, the evaporation rate of Bi and Se was controlled to be around 0.5 Å s$^{-1}$. The thicknesses of the Bi and Se layers were 10 and 15 nm, respectively. The pattern of the photodetection film was defined by a shadow mask. A rapid thermal process system (AccuThermo AW410) was used for rapid thermal annealing. A susceptor coated with inert silicon carbide was used to encase the substrate with evaporated films. The ramp temperature was ~100 K s$^{-1}$ with a steady time of less than 1 s. Thus, the synthesis time was 2 s and 4 s for RTA temperatures of 150 and 300° C., respectively. To avoid the overshoot and undershoot of the temperature profile and ensure repeatability, all parameters were carefully tuned.

During the treatment, high-purity Ar with a flow rate of 10 standard liters per minute (SLPM) was introduced into the system to protect the sample. Photodetectors were fabricated using metal lithography stencils to deposit the source and drain electrodes. The laser-cut mask with a distinct channel length of 60 µm was manually aligned on top of the pre-patterned photodetector film via an optical microscope. A 50 nm gold electrode layer was then deposited through thermal evaporation (rate: 1 Å s$^{-1}$).

Material Characterization

The texture of the film was characterized by GIWAXS using a small-angle X-ray scattering system (Xeuss 3.0). The sample-detector distance was set to 120 mm, and the exposure time was 1800 s. The phase composition was studied from the XRD (D2 Phaser X-ray Diffractometer System). The surface morphology was characterized by SEM (Quanta 450), and the crystallography structure was determined by TEM (CM-20, Philips). The elemental composition was obtained by the EDS module attached to the SEM. The film topography and the roughness were evaluated by AFM (MultiMode 8, Bruker). The Raman spectra were measured by the confocal microscope spectrometer (Alpha 300R, WITec). For the investigation of the surface chemical state, XPS was employed by using a Thermo ESCLAB 250Xi system. The thermal analysis during heating was realized by a differential scanning calorimeter (DSC 8000, PerkinElmer). A stoichiometric amount of high-purity Bi and Se powder was weighted and mixed in an agate mortar and then transferred into an aluminum pan, which was then cold pressed and sealed via a universal crimper press. In order to approximate the PIS process as closely as possible, the pellet was heated at a rate of 100 K min$^{-1}$.

Device Measurement

The temporal photovoltage and electronic performance were recorded by the Agilent 4155C semiconductor analyzer with a standard electrical probe station. The lasers (405, 450, 532, 635, and 1550 nm) were guided by an optical fiber and focused on the device with a microscope system, and were calibrated by a power meter (PM400, Thorlabs). For 405, 450, 532, and 635 nm lasers, a homemade light chopper and an attenuator were used to control the light and its intensity, respectively. While for 1550 nm laser, a modulator (AFG 2005, Arbitrary Function Generator, Good Will Instrument Co. Ltd) attached to the laser generator was used to modulate the IR irradiation. The Detectivity (D*) was calculated by the following formula:

$$D^* = R\sqrt{\frac{A}{2qV_{dark}}}$$

where R is the responsivity, A is the device area, q is the unit of charge, and $V_{dark}$ is the dark voltage. To determine the response time, the high-resolution photovoltage curve was recorded by a highly sensitive source/measurement system (B2912A, Keysight). Rise and decay times are defined as the time interval of the net voltage change between 10% and 90%, respectively. The temperature change on the film was recorded by an infrared camera (Ti480 PRO, Fluke), and it was synchronized with the change of photovoltage with and without illumination.

SPVM Measurement

To investigate the working mechanism of the PTE detector, a local laser illumination was used to study the photovoltage distribution. A high spatial resolution of the Vph was obtained by a 532 nm laser with a focused spot (diameter of 3 µm) and a constant power (0.5 mW). The device was mounted on a homemade sample holder to ensure the accuracy of the measurement. A low-noise current amplifier (SR570, Stanford Research Systems) and a lock-in amplifier (SR830, Stanford Research Systems) were used to examine the photovoltage during the scan.

Density Functional Theory (DFT) Calculation

Ab initio calculation was carried out within the DFT framework with Vienna Ab-initio Simulation Package (VASP). The core level electron wave functions were expanded with the full-potential projected augmented wave (PAW) method and the generalized gradient approximation (GGA) of Perdew-Burke-Ernzerhof (PBE) exchange-correlation functional was used to describe the interaction between electrons. The cutoff energy for the plane wave expansion was set to 400 eV. The convergence criteria for the force of the structure and the energy of the self-consistent calculation were set at $10^{-2}$ eV Å$^{-1}$ and $10^{-5}$ eV, respectively. A vacuum layer of 30 Å was built for all structures to avoid perturbation between neighboring layers. The transitional state was searched and the energy barrier was calculated using the CI-NEB with a force threshold of 0.03 eV Å$^{-1}$. The Brillion zone was sampled by a 3×3×1 grid mesh. The molecular dynamic simulation was achieved by the ab-initio molecular dynamic (AIMD) calculation with VASP. Considering the calculation efficiency, the energy cutoff was reduced to 350 eV and the Brillouin zone was only sampled by Γ point. AIMD trajectories were run with the canonical ensemble (NVT) at the temperature of 573 K. The time step of the AIMD was 2 fs with an overall time span of 20 and 15 ps for interdiffusion and crystal growth, respectively. The central part of $Se_1$—$Bi_1$—$Se_2$—$Bi'_1$—$Se'_1$ was fixed to simulate the primary cluster during the simulation.

Modeling and COMSOL Simulation

Two substrates were constructed with PI and $SiO_2$. The silicon wafer used in this work was covered with 285 nm $SiO_2$. Thus, the bottom Si was omitted from the model. The finite element method (FEM) was carried out via COMSOL Multiphysics. The electrode was built on the substrate based on the actual size of the device. In the meantime, the PTE film on the substrates was only tens of nanometers, which indicated that the thermal distribution of the substrate dominates that of the film. Hence, we neglected the effect of the film on the heat transfer in the COMSOL simulation. For the boundary condition, a convection of 5 W m$^{-2}$ K$^{-1}$ was used and applied to all top surfaces, and the bottom surface of the simulation domain was fixed at room temperature (293 K). The density ($SiO_2$: 2200 kg m$^{-3}$; PI: 1300 kg m$^{-3}$), heat capacity ($SiO_2$: 730 J kg$^{-1}$ K$^{-1}$; PI: 1100 J kg$^{-1}$ K$^{-1}$), and thermal conductivity ($SiO_2$: 1.4 W m$^{-1}$ K$^{-1}$; PI: 0.15 W m$^{-1}$ K$^{-1}$) were extracted from the material database in the software. Furthermore, the surface emissivity was considered to calculate the temperature distribution (0.83 and 0.75 for PI and $SiO_2$, respectively). The deposited beam power density P was quantified by Gaussian distribution as:

$$P = \frac{1}{2\pi r^2}\exp\left(-\frac{d^2}{2r^2}\right) \quad (4)$$

where r is the radius of the laser, and d is the distance between the light spot center and the specified point. The laser radius was 20 µm and the total power of the deposited light beam was 0.5 mW in the simulation.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto.

The invention claimed is:

1. A visible and infrared radiation photothermoelectric effect photodetector:
   a substrate having a low thermal diffusivity of less than 0.05 mm$^2$/sec;
   a thermoelectric metal chalcogenide film formed on the low thermal diffusivity substrate;
   at least two symmetric electrodes formed on the thermoelectric metal chalcogenide film such that the thermoelectric metal chalcogenide film forms a channel between the at least two symmetric electrodes;
   wherein the photodetector has a responsivity of at least approximately 65 V W$^{-1}$ for 1550 nm illumination and a response time less than approximately 60 ms and wherein a photodetector photoresponse is tunable via manipulation of local illumination.

2. The photodetector of claim 1, wherein the thermoelectric metal chalcogenide film has a metal selected from one or more of bismuth, lead, thallium, tin, or antimony and a chalcogen selected from one or more of tellurium or selenium.

3. The photodetector of claim 1, wherein the thermoelectric metal chalcogenide film is $Bi_2Se_3$.

4. The photodetector of claim 1, wherein the thermoelectric metal chalcogenide film is $Bi_2Te_3$, $SnTe_2$, $SnSe_2$, $Sb_2Te_3$, $Bi_{0.5}Sb_{1.5}Te_3$, or $Ag_2Se$.

5. The photodetector of claim 1, wherein the at least two symmetric electrodes are metallic electrodes.

6. The photodetector of claim 1, wherein the low thermal diffusivity substrate is a polymer.

7. A method of making the visible and infrared radiation photothermoelectric effect photodetector of claim 1, comprising:
   providing a substrate having a low thermal diffusivity of less than 0.05 mm$^2$/sec;
   forming a thermoelectric metal chalcogenide film on the low thermal diffusivity substrate:
      depositing one or more chalcogen layers on the low thermal diffusivity substrate;
      depositing one or more metal layers on the chalcogen layer;
      performing a thermal anneal of the one or more chalcogen layers and the one or more metal layers to form the thermoelectric metal chalcogenide film;
   forming at least two symmetric electrodes on the thermoelectric metal chalcogenide film such that the thermoelectric metal chalcogenide film forms a channel between the at least two symmetric electrodes.

8. The photodetector of claim 6, wherein the polymer is polyimide, polycarbonate, polystyrene, polyethylene terephthalate, polyester, polyamide, nylon, or mixtures thereof.

9. The method of claim 7, wherein the thermoelectric metal chalcogenide film has a metal selected from one or more of bismuth, lead, thallium, or antimony and a chalcogen selected from one or more of tellurium or selenium.

10. The method of claim 7, wherein the thermoelectric metal chalcogenide film is $Bi_2Se_3$.

11. The method of claim 7, wherein the thermoelectric metal chalcogenide film is $Bi_2Te_3$.

12. The method of claim 7, wherein the at least two symmetric electrodes are metallic electrodes.

13. The method of claim 7, wherein the low thermal diffusivity substrate is a polymer.

14. The method of claim 7, wherein an annealing temperature is 200° C. or less.

15. The method of claim 7, wherein an annealing temperature is 150° C. or less.

16. The method of claim 7, wherein the thermal anneal is a rapid thermal anneal.

17. The method of claim 13, wherein the polymer is polyimide, polycarbonate, polystyrene, polyethylene terephthalate, polyester, polyamide, nylon, or mixtures thereof.

* * * * *